United States Patent
Iwasaki et al.

(10) Patent No.: US 11,595,002 B2
(45) Date of Patent: Feb. 28, 2023

(54) METHOD FOR DETECTING POOR MOUNTING STATE OF MODULE, AND ARRAY

(71) Applicant: SUMITOMO ELECTRIC INDUSTRIES, LTD., Osaka (JP)

(72) Inventors: Takashi Iwasaki, Osaka (JP); Koji Mori, Osaka (JP); Kenji Saito, Osaka (JP); Kazushi Iyatani, Osaka (JP); Yoshikazu Kogetsu, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 341 days.

(21) Appl. No.: 16/770,536

(22) PCT Filed: Dec. 12, 2018

(86) PCT No.: PCT/JP2018/045630
§ 371 (c)(1),
(2) Date: Jun. 5, 2020

(87) PCT Pub. No.: WO2019/117189
PCT Pub. Date: Jun. 20, 2019

(65) Prior Publication Data
US 2021/0167725 A1 Jun. 3, 2021

(30) Foreign Application Priority Data

Dec. 14, 2017 (JP) .............................. JP2017-239388

(51) Int. Cl.
*H02S 50/15* (2014.01)
*H02S 20/32* (2014.01)
*H02S 40/22* (2014.01)

(52) U.S. Cl.
CPC .............. *H02S 50/15* (2014.12); *H02S 20/32* (2014.12); *H02S 40/22* (2014.12)

(58) Field of Classification Search
CPC .......... H02S 50/10; H02S 50/00; H02S 10/00; H02S 99/00; H02S 40/10; H02S 50/15;
(Continued)

(56) References Cited

U.S. PATENT DOCUMENTS 9,324,893 B1    4/2016  Kats et al.
2014/0124016 A1 5/2014  Iwasaki et al.
(Continued)

FOREIGN PATENT DOCUMENTS

CN    106768888 A    5/2017
JP    2014-127699 A  7/2014
(Continued)

*Primary Examiner* — Jermele M Hollington
*Assistant Examiner* — Taqi R Nasir
(74) *Attorney, Agent, or Firm* — Oliff PLC

(57) ABSTRACT

This method for detecting a poor module-mounting-state in a concentrator photovoltaic apparatus includes: photographing a surface of an array by an imaging device; obtaining an image in which a virtual image, magnified through a condenser lens, of a light receiving portion including a cell and a vicinity thereof is formed, and a collection of pixels of the virtual image forms a composite virtual image of an entirety of the light receiving portion, the composite virtual image being projected over a plurality of modules; and detecting a poor module-mounting-state based on a form of the composite virtual image.

10 Claims, 18 Drawing Sheets

(58) Field of Classification Search
CPC ......... H02S 20/32; H02S 40/22; G01N 21/94; G01R 29/24; G01R 15/08; G01R 15/12; G01R 15/125; G01R 15/165; G01R 15/20; F24F 11/52; F24F 11/32; F24F 11/62; H04L 27/02; H04L 27/04; H04L 27/38; H01R 33/02; H01R 4/48; H01R 11/18

See application file for complete search history.

(56) References Cited

U.S. PATENT DOCUMENTS

| | | | |
|---|---|---|---|
| 2015/0194561 A1* | 7/2015 | Toya | H01L 31/048 |
| | | | 250/208.1 |
| 2015/0270418 A1* | 9/2015 | Inagaki | H01L 31/0543 |
| | | | 136/246 |
| 2018/0204969 A1* | 7/2018 | Nagai | H02S 40/22 |
| 2018/0234046 A1 | 8/2018 | Saito et al. | |

FOREIGN PATENT DOCUMENTS

| | | |
|---|---|---|
| JP | 2014-226025 A | 12/2014 |
| JP | 2015-185676 A | 10/2015 |
| WO | 2012/169618 A1 | 12/2012 |
| WO | 2017/006712 A1 | 1/2017 |
| WO | 2017/022325 A1 | 2/2017 |

\* cited by examiner

METHOD FOR DETECTING POOR MOUNTING STATE OF MODULE, AND ARRAY

TECHNICAL FIELD

The present invention relates to a method for detecting a poor module-mounting-state, and an array.

This application claims priority on Japanese Patent Application No. 2017-239388 filed on Dec. 14, 2017, the entire content of which is incorporated herein by reference.

BACKGROUND ART

A concentrator photovoltaic apparatus has, as a minimum unit, a basic configuration of an optical system in which sunlight is collected by a condenser lens to be incident on a small cell for power generation. The basic configurations are arranged into a matrix shape in a housing, to form a module, and further, a large number of the modules are arranged to form an array (panel), whereby one concentrator photovoltaic apparatus is obtained. In order to track the sun, a tracking mount on which an array is mounted is supported by a post such that biaxial drive in the azimuth and the elevation is allowed (see PATENT LITERATURE 1, for example).

CITATION LIST

Patent Literature

PATENT LITERATURE 1: Japanese Laid-Open Patent Publication No. 2014-226025

SUMMARY OF INVENTION

The present disclosure includes the following invention. However, the present invention is defined by the claims.

A method for detecting a poor module-mounting-state according to an aspect of the present invention is a method for detecting a poor module-mounting-state in a concentrator photovoltaic apparatus. The method includes: photographing a surface of an array by an imaging device; obtaining an image in which a virtual image, magnified through a condenser lens, of a light receiving portion including a cell and a vicinity thereof is formed, and a collection of pixels of the virtual image forms a composite virtual image of an entirety of the light receiving portion, the composite virtual image being projected over a plurality of modules; and detecting a poor module-mounting-state based on a form of the composite virtual image.

An array according to an aspect of the present invention is an array formed by arraying a plurality of modules of a concentrator photovoltaic apparatus on a tracking mount. Each module has a basic configuration serving as an element thereof. The basic configuration includes: a condenser lens; a cell for power generation, the cell being provided at a position where sunlight is concentrated by the condenser lens; a secondary lens provided between the condenser lens and the cell, the secondary lens being configured to guide light concentrated by the condenser lens, to the cell; and a protection plate provided around the secondary lens, the protection plate being configured to reflect light, the protection plate having formed thereon a form serving as a division at least.

DESCRIPTION OF EMBODIMENTS

Problems to be Solved by the Present Disclosure

When the surface of an array is assumed to be one plane, the one plane is, ideally, always orthogonal (incident angle of 0 degrees) to the incident direction of sunlight, due to tracking. At this time, 200 modules, for example, forming the array are each positioned such that the sun is on an extended line of an optical axis connecting a condenser lens and a cell. Accordingly, power generation can be performed most efficiently.

However, in actuality, due to various causes, misalignment is caused between the incident direction of sunlight and the optical axis of a module. Conceivable causes for such misalignment are, in terms of the entirety of the array, problems in a drive mechanism or control, such as drive deviation of a tracking mount, tracking deviation, and the like.

Meanwhile, in terms of the module units, deflection of the frame of the tracking mount, misalignment due to construction, bending of a steel material, and the like are conceivable.

Figure 18:
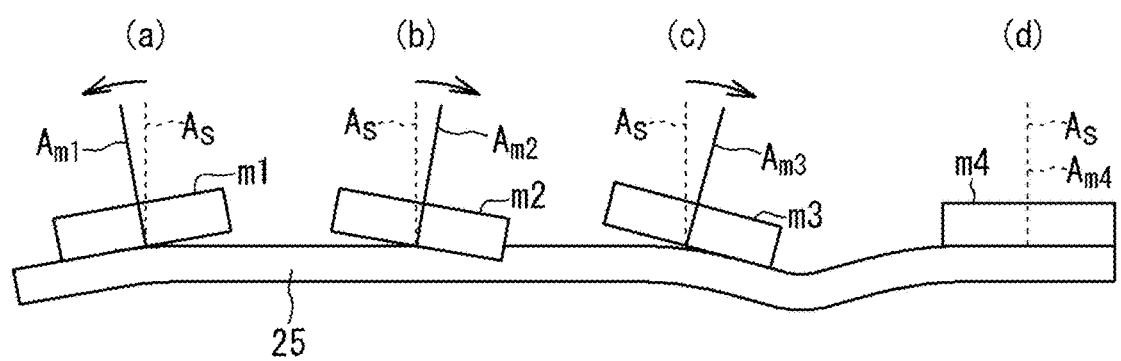
FIG. 18 shows an example of a cause of misalignment expressed in an exaggerated manner.

FIG. 18 shows an example of a cause of misalignment expressed in an exaggerated manner. In FIG. 18, when a mounting state is considered in terms of the module unit, as for a module m4 of (d) in an ideal mounting state with respect to a tracking mount 25, an incident direction $A_S$ of sunlight and an optical axis $A_{m4}$ of the module m4 are aligned with each other. In contrast to this, as for modules m1, m2, and m3 of (a), (b), and (c), optical axes $A_{m1}$, $A_{m2}$, $A_{m3}$ are each misaligned with respect to the incident direction $A_S$ of sunlight. That is, (a), (b), and (c) are each in a state of "poor module mounting".

If such poor module mounting is found, appropriate repair/adjustment can be performed. However, it is difficult to find poor module mounting by checking a giant array through visual observation of a person.

Therefore, an object of the present disclosure is to enable easy detection of poor module mounting.

Effects of the Present Disclosure

According to the present disclosure, poor module mounting can be easily detected. It should be noted that the poor module mounting includes poor mounting of an individual module as well as poor mounting in the entirety of an array caused by deformation of a tracking mount.

Summary of Embodiments

The summary of embodiments of the present disclosure includes at least the following.

(1) This is a method for detecting a poor module-mounting-state in a concentrator photovoltaic apparatus. The method includes: photographing a surface of an array by an imaging device; obtaining an image in which a virtual image, magnified through a condenser lens, of a light receiving portion including a cell and a vicinity thereof is formed, and a collection of pixels of the virtual image forms a composite virtual image of an entirety of the light receiving portion, the composite virtual image being projected over a plurality of modules; and detecting a poor module-mounting-state based on a form of the composite virtual image.

With respect to the array above, a state where the entirety of the array is in a plane, or where the surfaces of modules are not in a plane in a strict meaning but are parallel with each other, is defined as a state where flatness is maintained. If the module-mounting-state on the tracking mount is normal and the flatness is maintained, a composite virtual image of the light receiving portion projected in an image of the array reflects the real shape. However, if the module-mounting-state is poor and the flatness is impaired, the composite virtual image indicates a phenomenon such as becoming out of shape, being deformed, or the like, or is misaligned at the boundary of two modules adjacent to each other. Therefore, a poor module-mounting-state can be detected, based on the form of the composite virtual image. If poor mounting is detected, the mounting state can be quickly adjusted. Thus, poor mounting, which used to be difficult to find, is easily found and the mounting state is adjusted, whereby decrease in generated power can be suppressed.

(2) In the method for detecting the poor module-mounting-state according to (1), for example, the light receiving portion is provided with: a secondary lens configured to take in light concentrated by the condenser lens; and a protection plate configured to reflect light, and at least a shape of the protection plate is reflected in the composite virtual image.

In this case, the protection plate that reflects light deviated from the secondary lens and scattered light is in the composite virtual image, and provides contrast with respect to a portion having less light reflection and thus seen as dark, whereby the shape of the protection plate is easily seen.

(3) In the method for detecting the poor module-mounting-state according to (2), the protection plate may have a shape that is annular.

In this case, the annular shape of the protection plate is also reflected in the composite virtual image. A circular shape allows manifestation of discontinuity due to poor flatness, even if the direction of the misalignment is any of the vertical, horizontal, or oblique direction. In addition, not only the outer periphery but also the inner periphery is useful for detection of the misalignment.

(4) In the method for detecting the poor module-mounting-state according to (2) or (3), a poor module-mounting-state may be detected, based on deformation of the shape of the protection plate, the shape being reflected in the composite virtual image.

In this case, for example, occurrence of a poor module-mounting-state due to deformation of the tracking mount can be found.

(5) In the method for detecting the poor module-mounting-state according to any one of (1) to (4), for example, the imaging device is installed in an aerial vehicle.

In this case, the entire surface of the array can be easily and quickly photographed from an arbitrary position and distance. In addition, for example, if a small aerial vehicle such as a so-called drone is used, the aerial vehicle can perform photographing during photovoltaic power generation, with the back side thereof oriented toward the sun.

(6) This is an array formed by arraying a plurality of modules of a concentrator photovoltaic apparatus on a tracking mount. Each module has a basic configuration serving as an element thereof. The basic configuration includes: a condenser lens; a cell for power generation, the cell being provided at a position where sunlight is concentrated by the condenser lens; a secondary lens provided between the condenser lens and the cell, the secondary lens being configured to guide light concentrated by the condenser lens, to the cell; and a protection plate provided around the secondary lens, the protection plate being configured to reflect light, the protection plate having formed thereon a form serving as a division at least.

In the array configured as above, an image appears in which: a virtual image, magnified through a condenser lens, of the light receiving portion including the secondary lens and the protection plate of the basic configuration is formed; and a collection of pixels of the virtual image forms a composite virtual image of the entirety of the light receiving portion, the composite virtual image being projected over a plurality of modules. Thus, if the array is photographed by an imaging device from a position opposed to and away from the surface of the array, it is possible to photograph the composite virtual image of the light receiving portion projected in an image of the array. If the module-mounting-state on the tracking mount is normal and the flatness is maintained, a composite virtual image of the light receiving portion reflects the real shape. However, if the module-mounting-state is poor and the flatness is impaired, the composite virtual image becomes out of shape, or at least the position of the division is misaligned at the boundary of two modules adjacent to each other. Therefore, a poor module-mounting-state can be detected, based on the composite virtual image. If poor mounting is detected, the mounting state can be quickly adjusted. Thus, poor mounting, which used to be difficult to find, is easily found and the mounting state is adjusted, whereby decrease in generated power can be suppressed.

Details of Embodiments

Hereinafter, an embodiment of the present disclosure will be described with reference to the drawings.

Photovoltaic Apparatus

Figure 1:
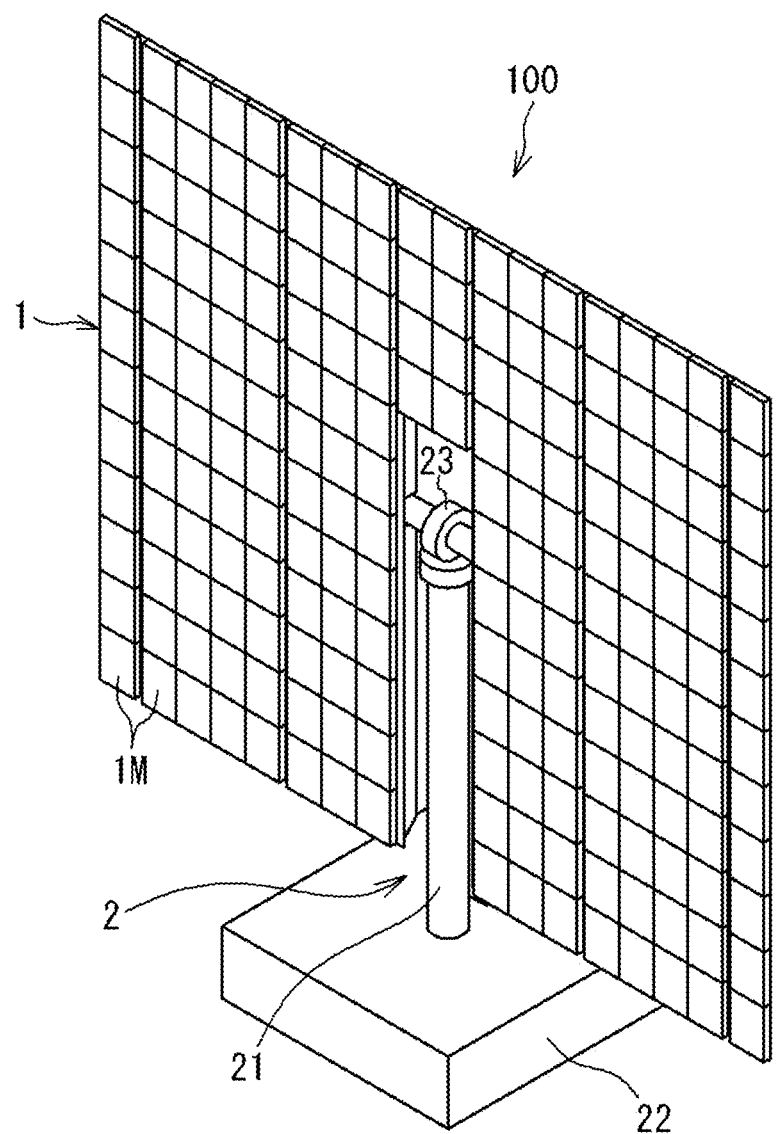
FIG. 1 is a perspective view of an example of one concentrator photovoltaic apparatus viewed from a light receiving surface side thereof, and shows the photovoltaic apparatus in a completed state.
Figure 2:
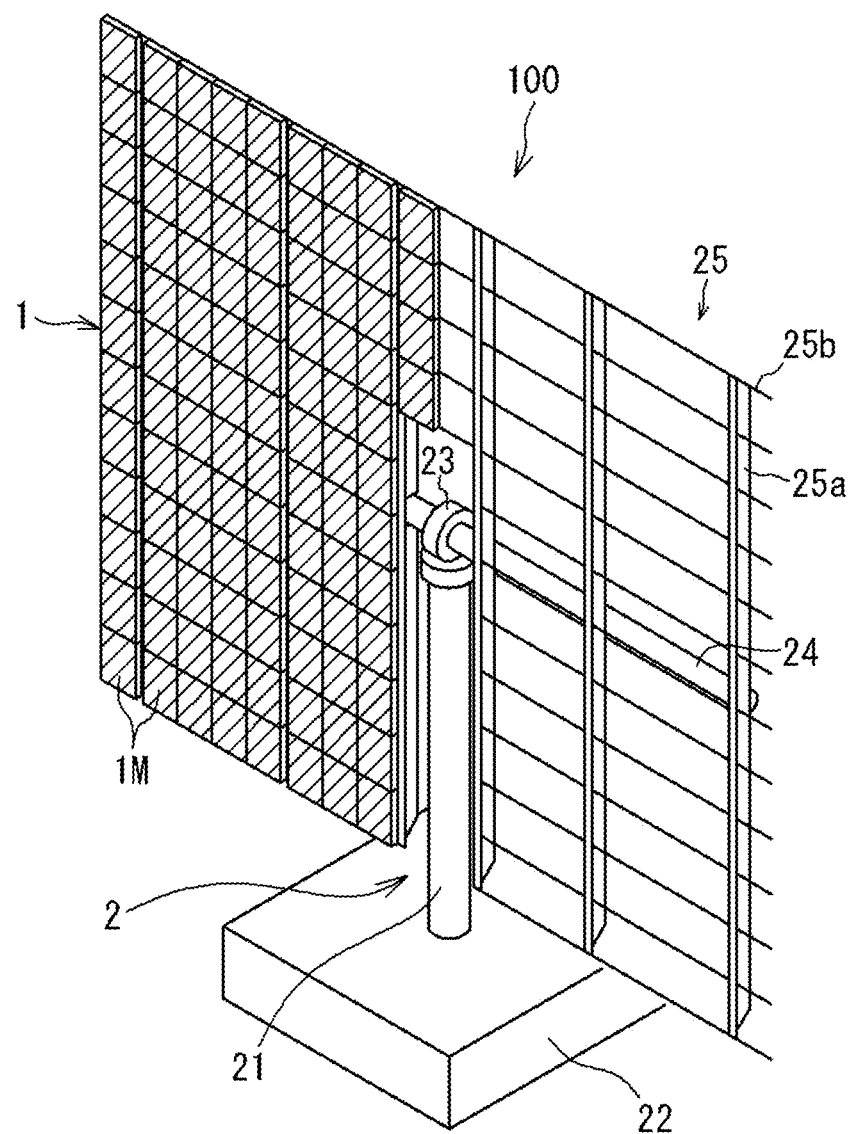
FIG. 2 is a perspective view of an example of one concentrator photovoltaic apparatus viewed from a light receiving surface side thereof, and shows the photovoltaic apparatus in a state of being assembled.

FIG. 1 and FIG. 2 are each a perspective view of an example of one concentrator photovoltaic apparatus viewed from the light receiving surface side thereof. FIG. 1 shows a photovoltaic apparatus 100 in a completed state. FIG. 2 shows the photovoltaic apparatus 100 in a state of being assembled. The right half of FIG. 2 shows a state where the framework of the tracking mount 25 is seen, and the left half of FIG. 2 shows a state where modules 1M are mounted. In actuality, when the modules 1M are to be mounted to the tracking mount 25, mounting is performed in a state where the tracking mount 25 is laid on the ground.

In FIG. 1, the photovoltaic apparatus 100 includes: an array (the entire photovoltaic panel) 1 having a shape that is continuous on the upper side and is divided into left and right portions on the lower side; and a support device 2 therefor. The array 1 is formed by arraying the modules 1M on the tracking mount 25 (FIG. 2), with the tracking mount 25 on the rear side. In the example shown in FIG. 1, the array 1 is formed as an assembly composed of 200 modules 1M in total, i.e., (96(=12×8)×2) modules forming the right and left wings and 8 modules 1M forming the connection portion at the center.

The support device 2 includes a post 21, a base 22, a biaxial drive part 23, and a horizontal shaft 24 (FIG. 2) serving as a drive shaft. The lower end of the post 21 is fixed to the base 22, and the upper end of the post 21 is provided with the biaxial drive part 23.

In FIG. 1, the base 22 is firmly embedded in the ground to an extent that only the upper face of the base 22 is seen. In the state where the base 22 is embedded in the ground, the post 21 extends vertically and the horizontal shaft 24 (FIG. 2) extends horizontally. The biaxial drive part 23 can rotate the horizontal shaft 24 in two directions of azimuth (angle around the post 21 as the center axis) and elevation (angle around the horizontal shaft 24 as the center axis). In FIG. 2, a reinforcement member 25a that reinforces the tracking mount 25 is mounted to the horizontal shaft 24. In addition, a plurality of rails 25b extending in the horizontal direction are mounted to the reinforcement member 25a. Therefore, if the horizontal shaft 24 is rotated in the direction of azimuth or elevation, the array 1 is also rotated in that direction.

FIG. 1 and FIG. 2 show the support device 2 that supports the array 1 by means of a single post 21. However, the configuration of the support device 2 is not limited thereto. That is, any support device that can support the array 1 so as to be movable in two axes (azimuth, elevation) can be employed.

Configuration Example of Module

Figure 3:
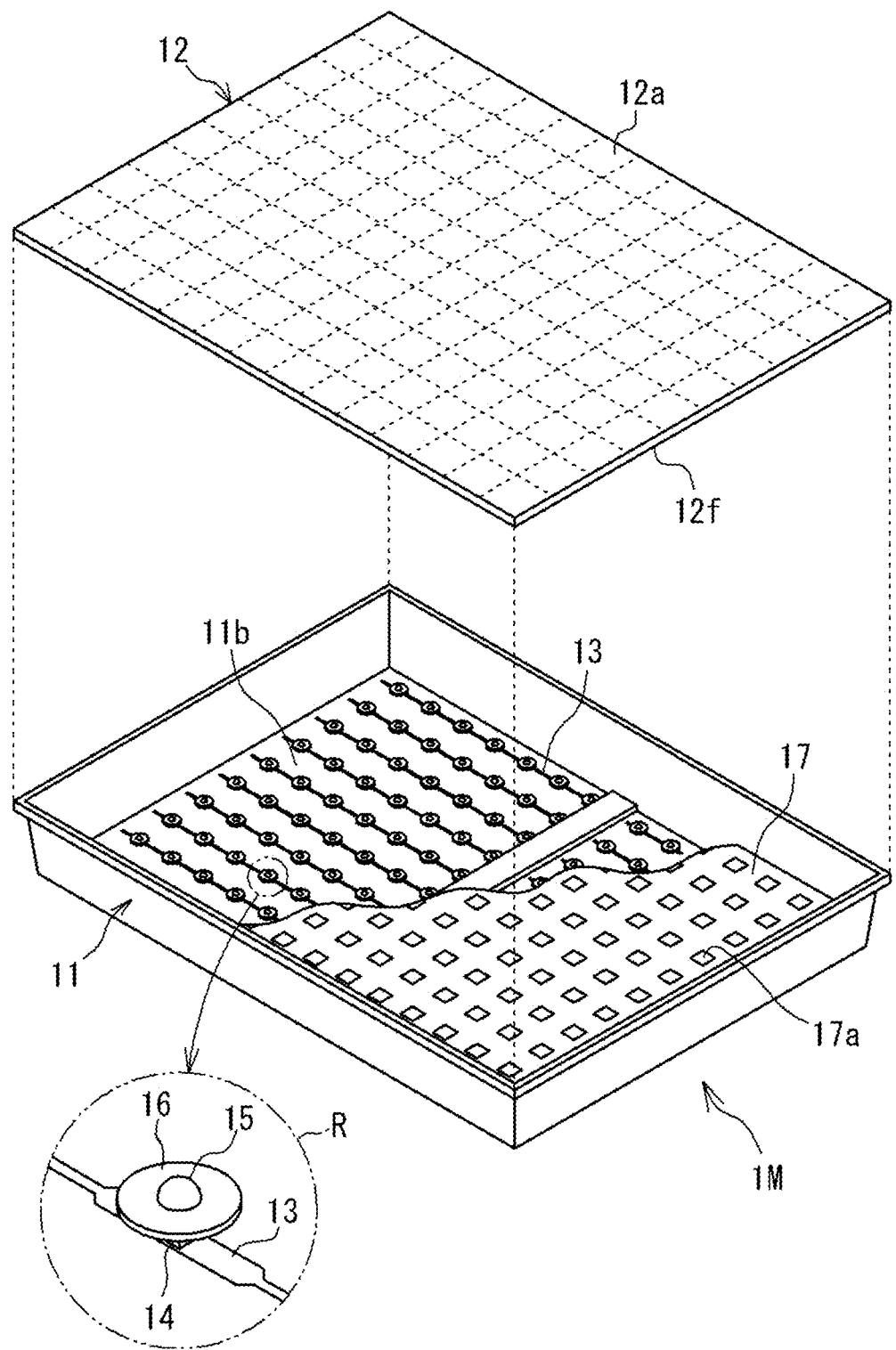
FIG. 3 is a perspective view showing an example of a configuration of a module.

FIG. 3 is a perspective view showing an example of a configuration of the module 1M. In FIG. 3, in terms of the physical form in appearance, the module 1M includes: a housing 11 made of metal and having a rectangular flat-bottomed container shape; and a concentrating portion 12 mounted, like a cover, to the housing 11, for example. The concentrating portion 12 is formed by attaching resin condenser lenses 12f to the back face of a single transparent glass plate 12a, for example. For example, each of square (10×14) sections that are shown is a Fresnel lens serving as a condenser lens 12f, and can cause sunlight to be converged at the focal point.

A flexible printed circuit 13 is disposed on a bottom face 11b of the housing 11. Cell packages 14 each holding a cell (power generating element) are mounted at predetermined positions on the flexible printed circuit 13. In FIG. 3, the portion surrounded by a "○" depicted by a chain double-dashed line is an enlarged figure of a light receiving portion R. In the light receiving portion R, a secondary lens 15 is provided on the cell package 14, and a protection plate 16 is provided around the secondary lens. The secondary lens 15 is a ball lens, for example. The protection plate 16 is an annular shaped metal body, for example, and a commercially available washer can be used. When converged sunlight deviates from the secondary lens 15, the protection plate 16 prevents the converged light from causing thermal damage to the periphery of the cell. Even when all the converged light enters the secondary lens 15, the protection plate 16 receives scattered light in the housing 11 and reflects the scattered light.

The light receiving portions R are provided so as to respectively correspond to the condenser lenses 12f by the same number and at the same interval. A shielding plate 17 is provided between the light receiving portion R and the concentrating portion 12. In the shielding plate 17, at positions corresponding to the individual condenser lenses 12f, square openings 17a each having a shape similar to the outer shape of one condenser lens 12f are formed. The light converged by the condenser lens 12f passes through the opening 17a. When the incident direction of sunlight is greatly deviated from the optical axis of the light receiving portion R, the light that will be concentrated to a deviated position hits the shielding plate 17.

Figure 4:
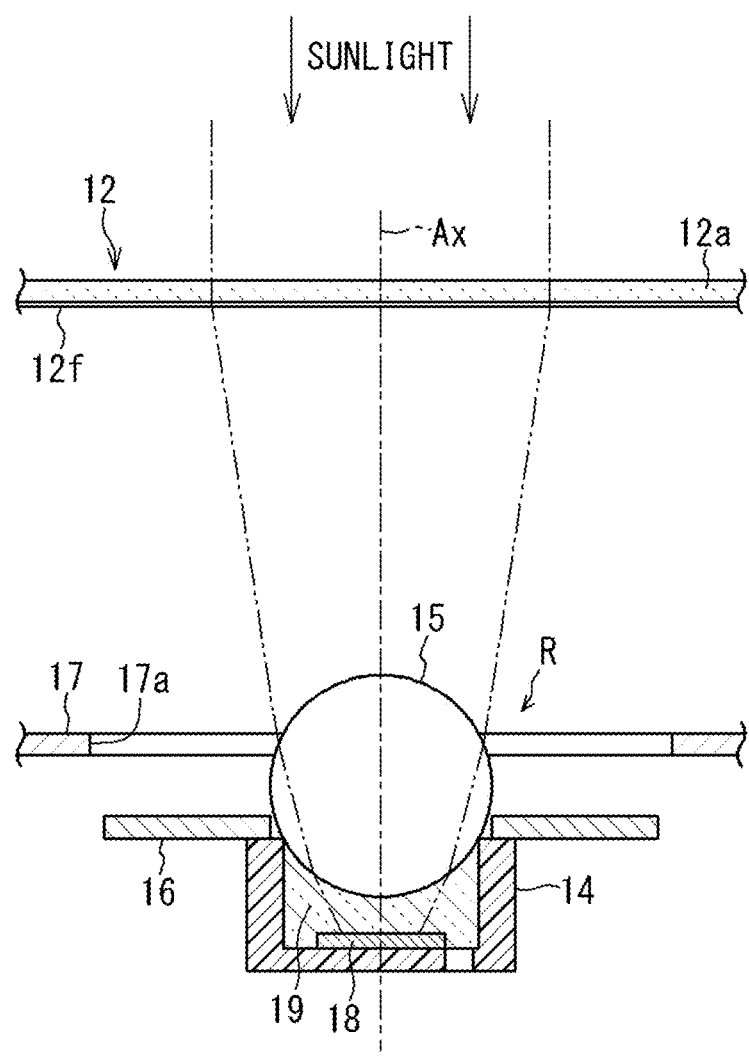
FIG. 4 is an example of a cross-sectional view showing a minimum basic configuration of an optical system.

FIG. 4 is an example of a cross-sectional view showing the minimum basic configuration of an optical system. In FIG. 4, when the incident direction of sunlight is perpendicular to the condenser lens 12f of the concentrating portion 12 and the incident direction and an optical axis Ax are parallel to each other, the light converged by the condenser lens 12f passes through the opening 17a of the shielding plate 17 and is incident on the secondary lens 15. The secondary lens 15 guides the incident light to a cell 18. The cell 18 is held in the cell package 14. The protection plate 16 is mounted so as to be placed on the upper end of the cell package 14. A light-transmissive resin 19 is enclosed between the secondary lens 15 and the cell 18.

Figure 5:
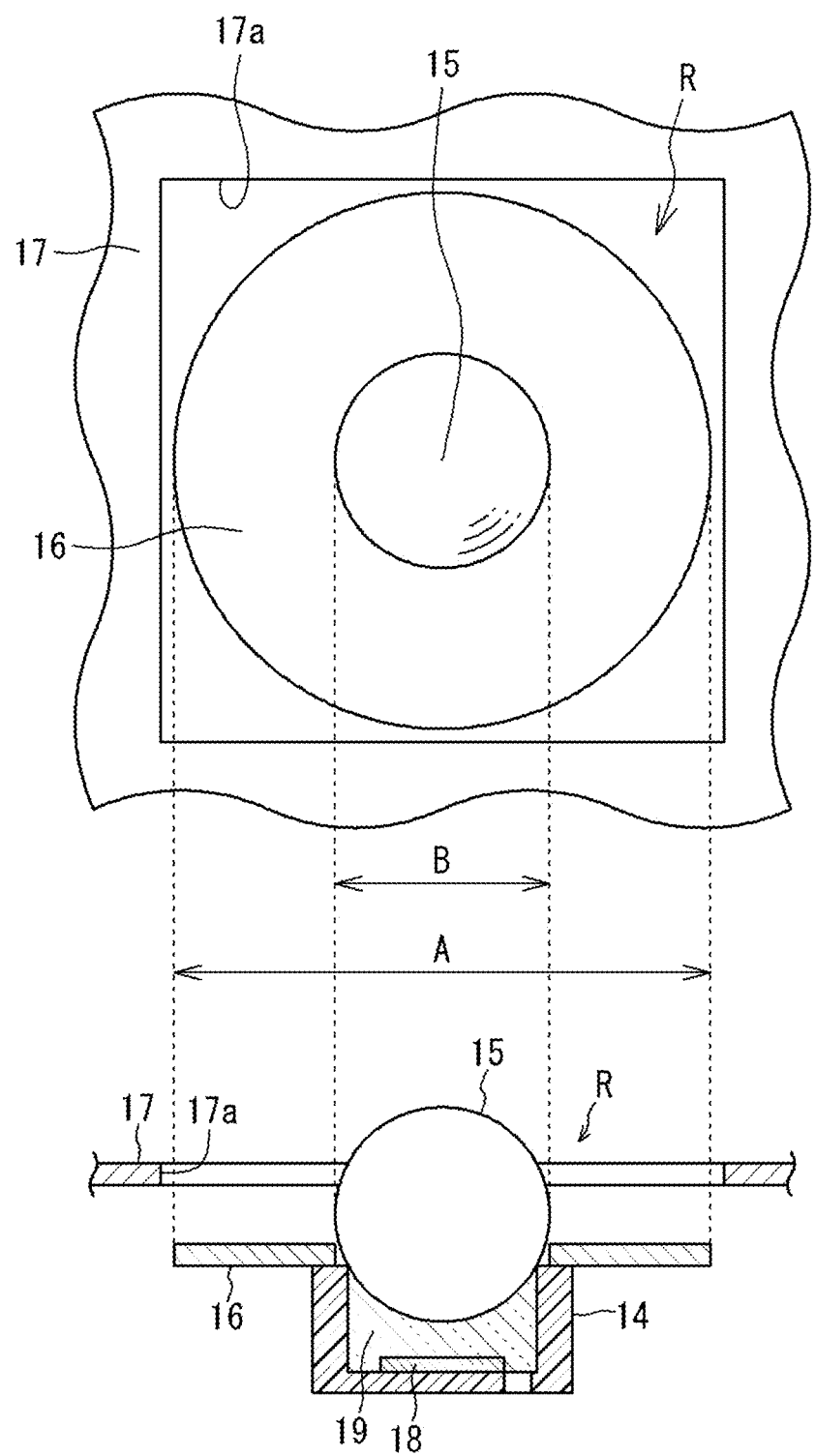
FIG. 5 shows a plan view (upper) and a cross-sectional view (lower) of a light receiving portion.

FIG. 5 shows a plan view (upper) and a cross-sectional view (lower) of the light receiving portion R. An outer diameter A (15 mm, for example) of the protection plate 16 is slightly smaller than the inside dimension (18 mm, for example) of the opening 17a. An inner diameter B of the protection plate 16 is substantially equal to the outer diameter (5 mm, for example) of the secondary lens 15. In a plan view, the protection plate 16 and the secondary lens 15 are seen in the opening 17a.

Capturing Image of Array

Figure 6:
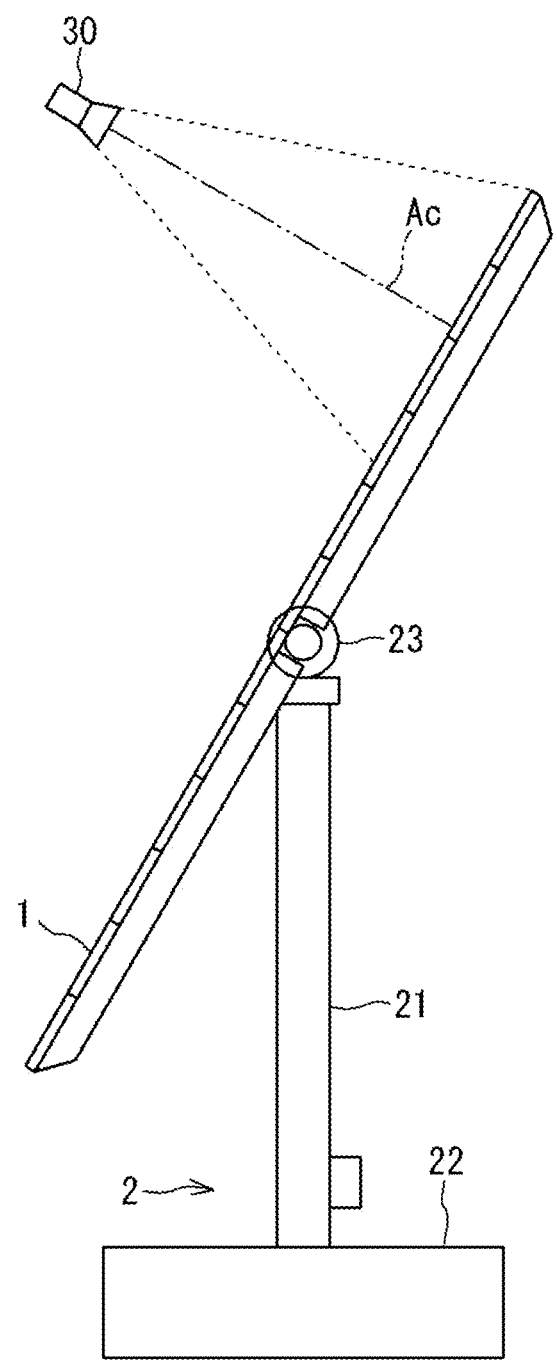
FIG. 6 is a side view showing an example of a state where an array is photographed.

FIG. 6 is a side view showing an example of a state where the array 1 is photographed. As shown in FIG. 6, the array 1 is photographed from the front by using a camera 30 (imaging device). In FIG. 6, the camera 30 is depicted as if the camera 30 is near the array 1, but in actuality, photographing is performed by a high-precision camera from far away from the surface of the array 1. The camera 30 photographs the array 1 such that the optical axis Ac of the camera 30 is perpendicular to the array 1. While being moved up, down, right, and left, the camera 30 photographs the entirety of the array 1. When photographing is performed, the distance between the array 1 and the camera 30 may not necessarily be constant, and it is sufficient that photographing is performed so as to scan the entirety of the array.

Figure 7:
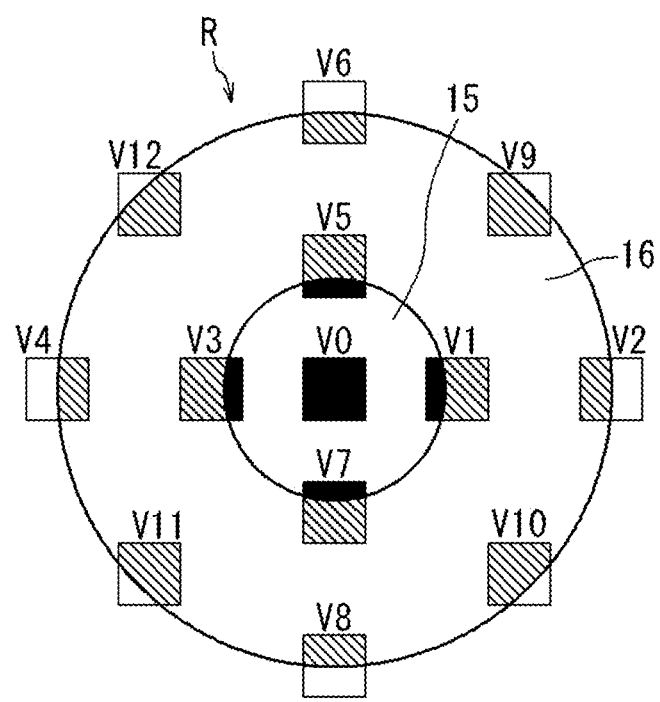
FIG. 7 shows an example of how a secondary lens and a protection plate of the light receiving portion are seen from a camera.

FIG. 7 shows an example of how the secondary lens 15 and the protection plate 16 of the light receiving portion R are seen from the camera 30. In the field of view of the camera 30, many light receiving portions R are projected around the light receiving portion R that is on the optical axis Ac. When viewed from the camera 30 side, the secondary lens 15 and the protection plate 16 are seen as a virtual image magnified through a "magnifying glass", i.e., the condenser lens 12f. The light receiving portion R on the optical axis Ac of the camera 30 is seen as a virtual image V0 for which the center of the secondary lens 15 is magnified. The virtual image V0 is seen to be dark due to little light reflection from the surface of the secondary lens 15. Even when not being exactly on the optical axis Ac, the light receiving portions R in the vicinity thereof are also seen as dark virtual images.

When viewed from the camera 30, the light receiving portion R that is slightly to the right relative to the optical axis Ac is viewed not from the center of the corresponding condenser lens 12f but slightly from the left, and thus, is seen as a virtual image V1, for example, and the boundary between the secondary lens 15 and the protection plate 16 is seen. The protection plate 16 reflects scattered light and thus seen brighter than the secondary lens 15, and thus, the contrast of light at the boundary is clear. The light receiving portion R that is further to the right relative to the optical axis Ac is viewed from the left end of the corresponding condenser lens 12f, and thus, is seen as a virtual image V2, for example, and the boundary (i.e., the outer contour of the protection plate 16) between the protection plate 16 and the periphery thereof is seen. Light reflection in the periphery is less than at the protection plate 16, and thus, the contrast of light at the boundary is clear.

When viewed from the camera 30, the light receiving portion R that is slightly to the left relative to the optical axis Ac is viewed not from the center of the corresponding condenser lens 12f but slightly from the right, and thus, is seen as a virtual image V3, for example, and the boundary between the secondary lens 15 and the protection plate 16 is seen. The light receiving portion R that is further to the left relative to the optical axis Ac is viewed from the right end of the corresponding condenser lens 12f, and thus, is seen as a virtual image V4, for example, and the outer contour of the protection plate 16 is seen.

Similarly, when viewed from the camera 30, the light receiving portion R that is slightly to the upper side relative to the optical axis Ac is viewed not from the center of the corresponding condenser lens 12f but slightly from the lower side, and thus, is seen as a virtual image V5, for example, and the boundary between the secondary lens 15 and the protection plate 16 is seen. The light receiving portion R that is further to the upper side relative to the optical axis Ac is viewed from the lower end of the corresponding condenser lens 12f, and thus, is seen as a virtual image V6, for example, and the outer contour of the protection plate 16 is seen.

When viewed from the camera 30, the light receiving portion R slightly to the lower side relative to the optical axis Ac is viewed not from the center of the corresponding condenser lens 12f but slightly from the upper side, and thus is seen as a virtual image V7, for example, and the boundary between the secondary lens 15 and the protection plate 16 is seen. The light receiving portion R further to the lower side relative to the optical axis Ac is viewed from the upper end of the corresponding condenser lens 12f, and thus is seen as a virtual image V8, for example, and the outer contour of the protection plate 16 is seen.

Further, when viewed from the camera 30, the light receiving portions R that are to the obliquely upper right, obliquely lower right, obliquely lower left, and obliquely upper left relative to the optical axis Ac are similarly seen as virtual images V9, V10, V11, and V12, respectively.

As described above, if the array 1 is photographed by the camera 30 from a position opposed to and away from the surface of the array 1, it is possible to obtain an image in which: a virtual image, magnified through a condenser lens 12f, of the light receiving portion R is formed; and a collection of pixels of the virtual image forms a composite virtual image of an entirety of the light receiving portion R, the composite virtual image being projected over a plurality of modules 1M. On the basis of the form of this composite virtual image, a poor mounting state of the module 1M relative to the tracking mount 25 can be detected.

In the array 1 described above, if the mounting state of the module 1M on the tracking mount 25 is normal, and the flatness is maintained, the composite virtual image of the light receiving portion R projected in the image of the array 1 reflects the real shape. However, if the mounting state of the module 1M is poor and the flatness is impaired, the composite virtual image becomes out of shape or is misaligned at the boundary of two modules adjacent to each other. Therefore, a poor module-mounting-state can be detected, based on the form of the composite virtual image. If poor mounting is detected, the mounting state can be quickly adjusted. Thus, poor mounting, which used to be difficult to find, is easily found and the mounting state is adjusted, whereby decrease in generated power can be suppressed.

The light receiving portion R is provided with: the secondary lens 15 that takes in the light concentrated by the condenser lens 12f; and the protection plate 16 that reflects light. At least the shape of the protection plate 16 is reflected in the composite virtual image. In this case, the protection plate 16 that reflects light deviated from the secondary lens 15 and scattered light is in the composite virtual image, and provides contrast with respect to a portion having less light reflection and thus seen as dark, whereby the shape of the protection plate 16 is easily seen.

In addition, since the protection plate 16 has a shape that is annular, the annular shape of the protection plate 16 is also reflected in the composite virtual image. A circular shape allows manifestation of discontinuity due to poor flatness, even if the direction of the misalignment between modules is any of the vertical, horizontal, or oblique direction. In addition, not only the outer periphery of the protection plate 16 but also the inner periphery thereof are useful for detection of the misalignment.

EXAMPLE

Figure 8:
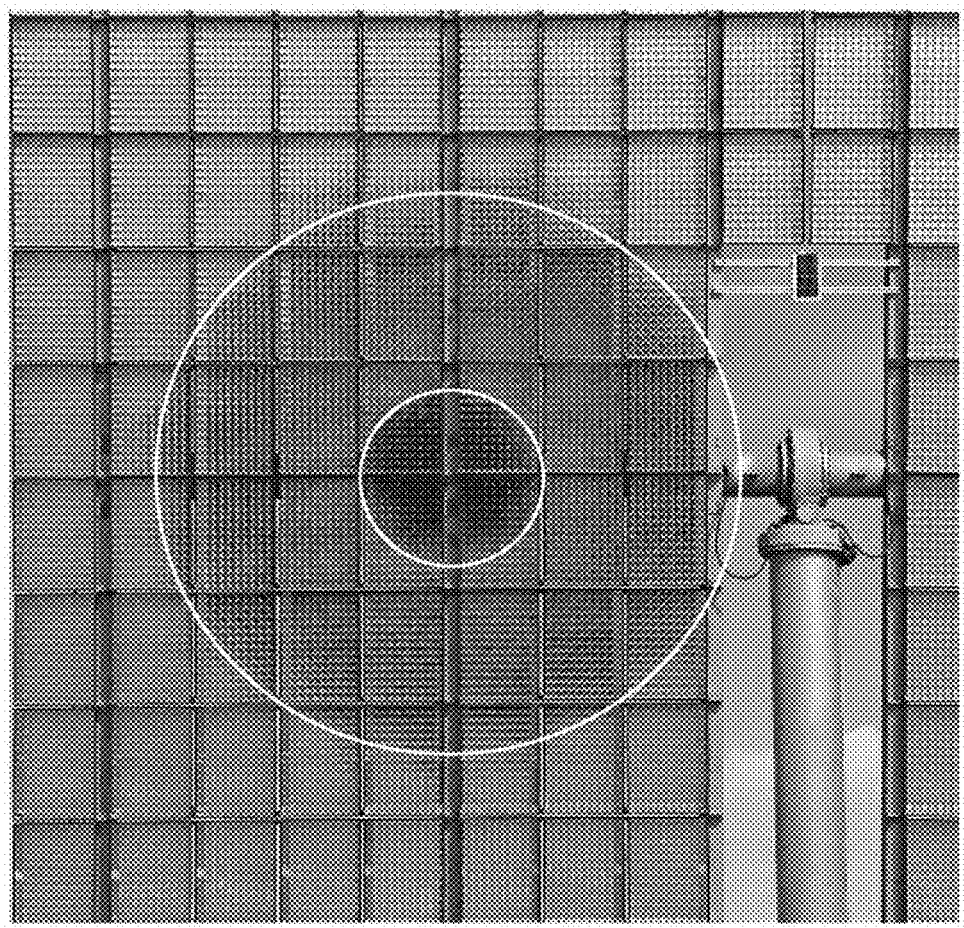
FIG. 8 shows a state where the light receiving portion is projected as a composite virtual image in a taken image of the array.

FIG. 8 is an example of a view showing a state where the light receiving portion R is projected as a normal composite virtual image in a taken image of the array 1. As shown by the two concentric circles in FIG. 8, the shapes of the secondary lens 15 and the protection plate 16 forming the light receiving portion R appear as a magnified composite virtual image. If such an image can be photographed, the modules in the range of the composite virtual image are mounted accurately.

Figure 9:
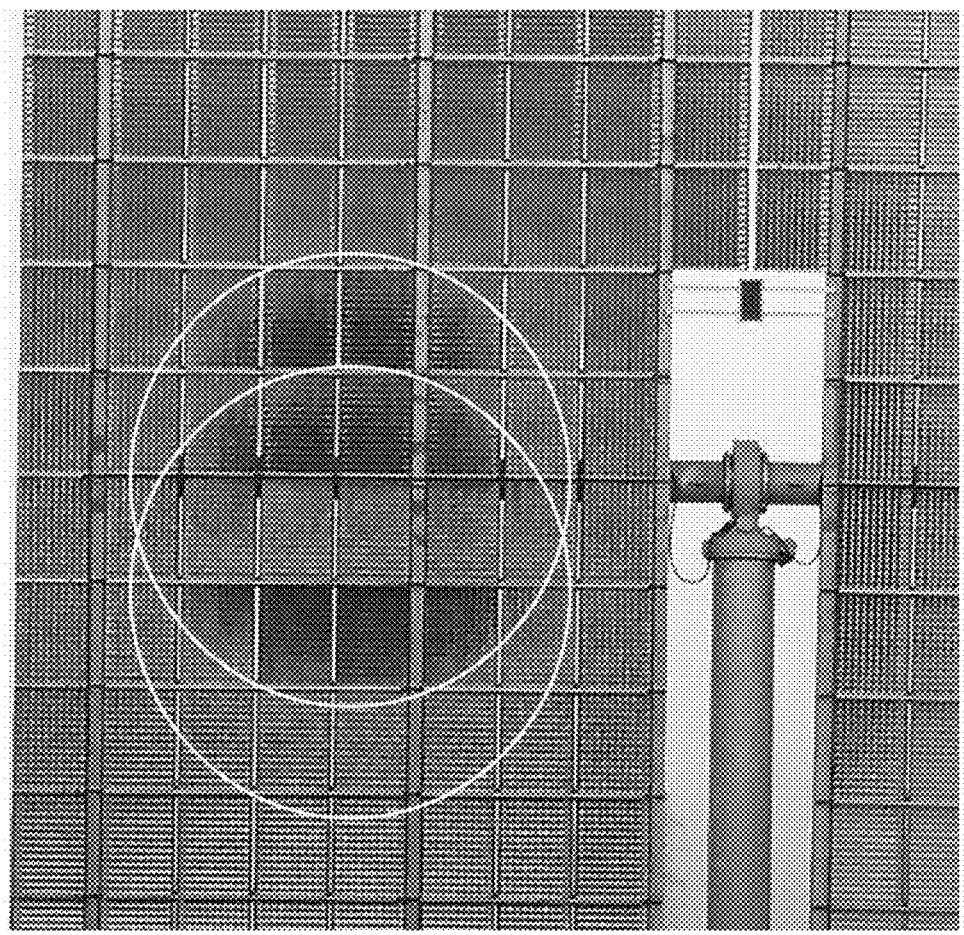
FIG. 9 shows a state where the light receiving portion is projected as a not normal composite virtual image in a taken image of the array.

Meanwhile, FIG. 9 shows a state where the light receiving portion R is projected as a not normal composite virtual image in a taken image of the array 1. When compared with FIG. 8, it is clear that the portion of the secondary lens 15 in the composite virtual image is out of shape and is projected as if separated in the up and down directions. When such an image is obtained, the mounting state of a plurality of modules in the two circles is poor. In this case, when the poor mounting of the plurality of modules in the two circles is adjusted and the composite virtual image as shown in FIG. 8 is obtained, the adjustment is completed. For each module, there is a small amount of leeway in mounting in the up, down, right, and left directions, and thus, the adjustment can be performed within the range. As for the height, the adjustment can be performed by, for example, inserting a height adjustment shim (thin plate adjustment member) or by the number of the adjustment shims being changed.

Figure 10:
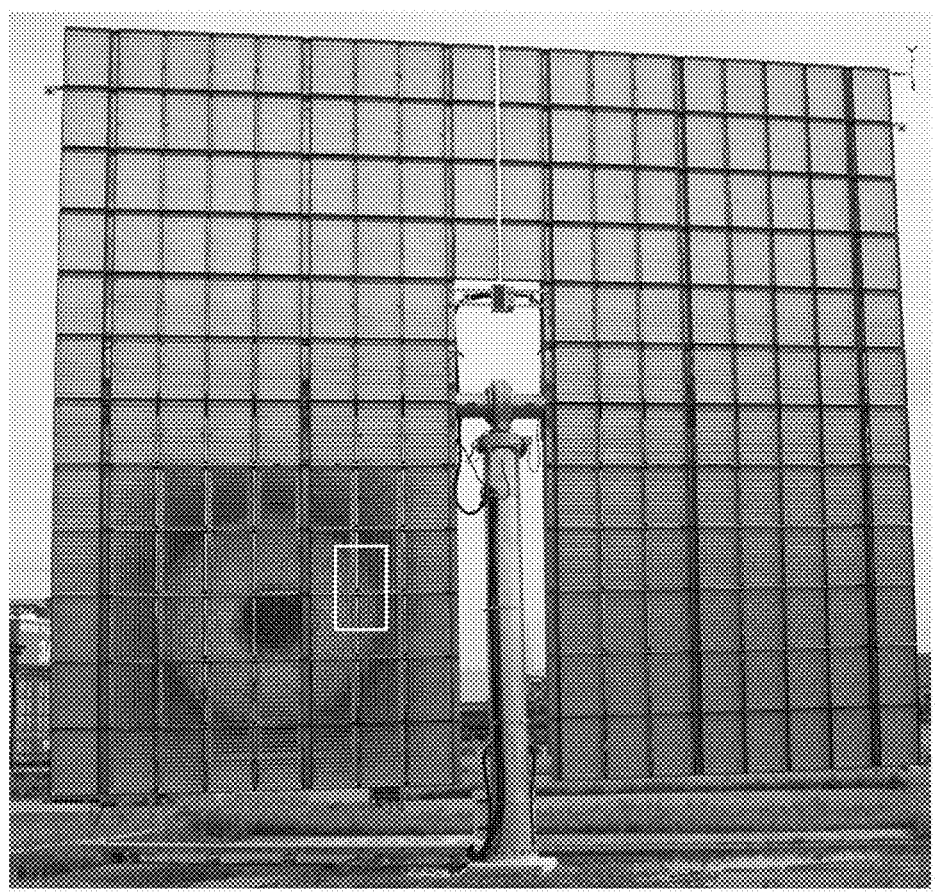
FIG. 10 shows another example in which the shapes of the secondary lens and the protection plate are projected as a magnified composite virtual image in a taken image of the array.
Figure 10:
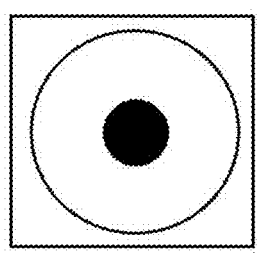

FIG. 10 shows another example in which the shapes of the secondary lens 15 and the protection plate 16 are projected as a magnified composite virtual image in a taken image of the array 1. As the composite virtual image, the shape shown in the lower part of FIG. 10 is seen to be projected in the image.

Figure 11:
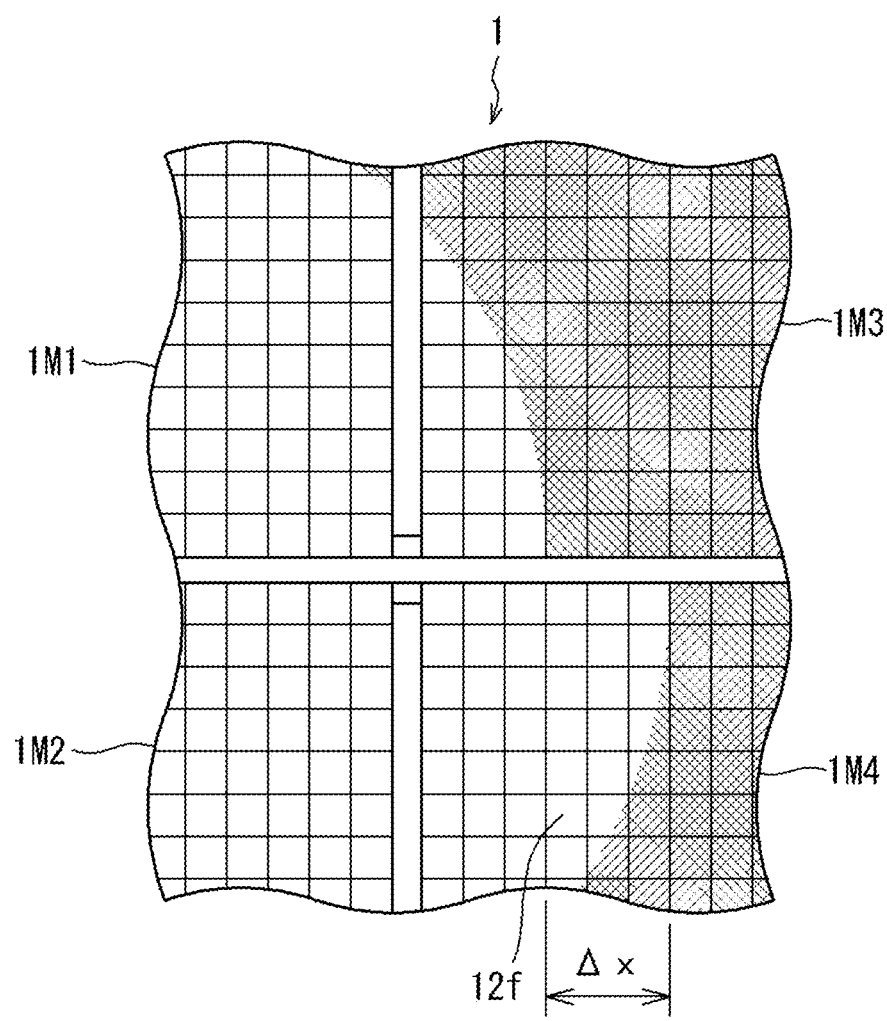
FIG. 11 is an enlarged view of the portion of the white rectangle in FIG. 10, with the contrast in the feature portion emphasized for easy recognition.

FIG. 11 is an enlarged view of the white rectangular portion in FIG. 10, with the contrast in the feature portion emphasized for easy recognition. In the white portion in FIG. 11, the protection plate 16 is projected as a virtual image. The boundary with respect to the dark portion is the contour of the protection plate 16. Among the four projected modules 1M1, 1M2, 1M3, and 1M4, the contour of the protection plate 16 is obviously misaligned between the modules 1M3 and 1M4. Thus, at least one of the modules 1M3 and 1M4 is poorly mounted.

A misalignment amount Δx in FIG. 11 substantially corresponds to three condenser lenses 12f. The size of each condenser lens 12f is 57 mm×57 mm, for example. Therefore, the misalignment amount Δx is about 17 cm. When the distance between the array 1 and the camera 30 is defined as L, and the angular misalignment amount of the surfaces between the module 1M3 and the module 1M4 viewed from the camera 30 is defined as Δθ, $$\Delta x = L \cdot \sin(\Delta\theta) \approx L(\Delta\theta)$$

is obtained. On the basis of this formula, the misalignment amount of the angle can also be estimated.

When such a poor module-mounting-state is found, an operator performs adjustment on at least the modules 1M3 and 1M4, mainly for the left-right direction/the height so that the misalignment amount Δx becomes 0. When the composite virtual image as shown in FIG. 8 is obtained through the adjustment, the adjustment is completed.

Figure 12:
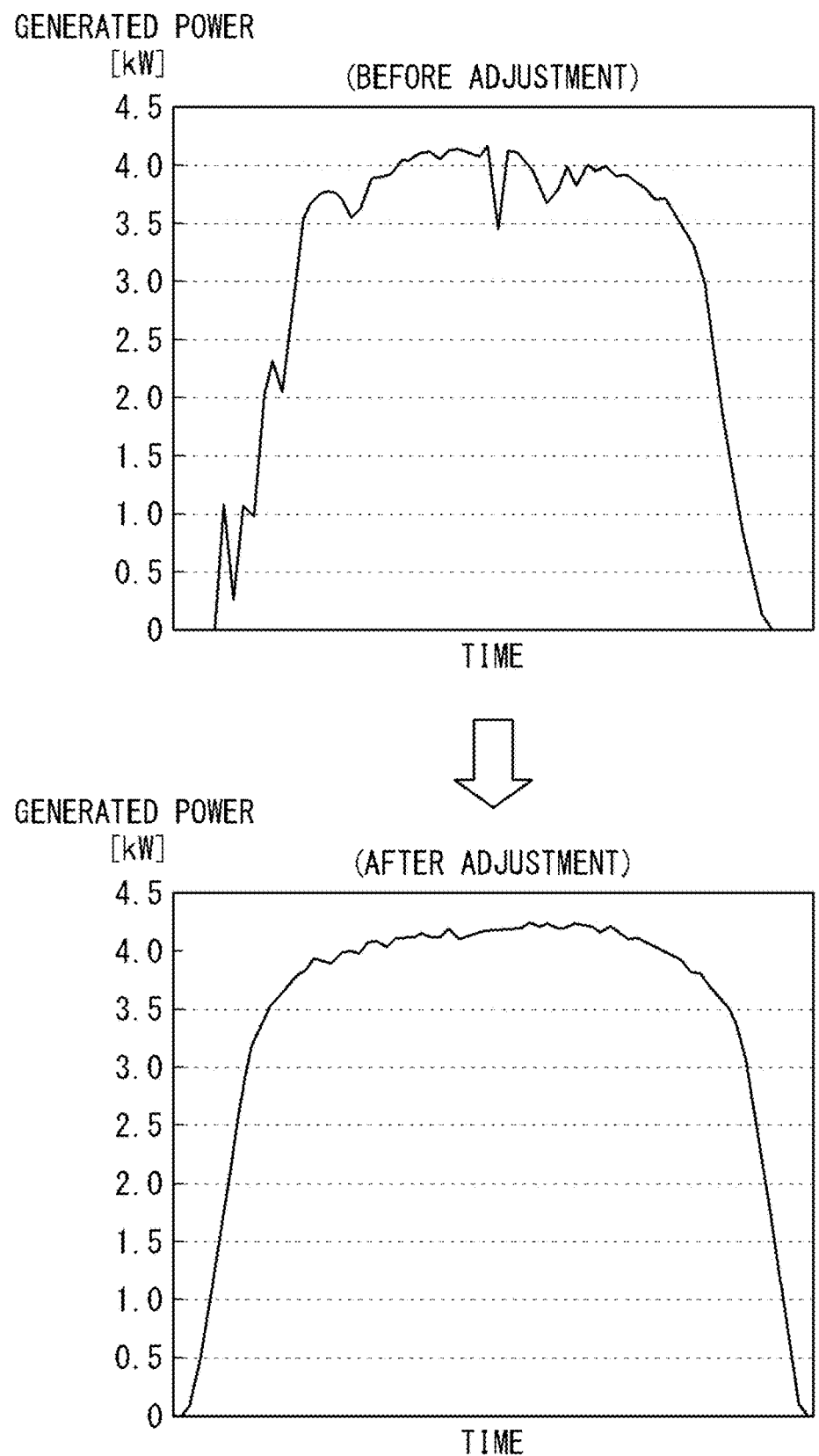
FIG. 12 is graphs showing an example in which, with respect to the flatness of the array, generated power is compared before and after adjustment.

FIG. 12 is graphs showing an example in which, with respect to the flatness of the array 1, generated power is compared before and after the adjustment as described above. Before the adjustment as indicated in the upper graph, generated power is seen to be uneven depending on the time. After the adjustment as indicated in the lower graph, since the flatness is improved, power generation is performed relatively evenly all day long and the amount of generated power in one day is increased.

Specific Example of Imaging Device

In order to photograph the array 1, for example, it is conceivable that a person lifts and operates the camera 30 using a pole-like supporter to take a photograph, or a person holding the camera 30 gets on a gondola of a vehicle for high lift work and takes a photograph. However, periodically performing such work causes large work burden.

Figure 13:
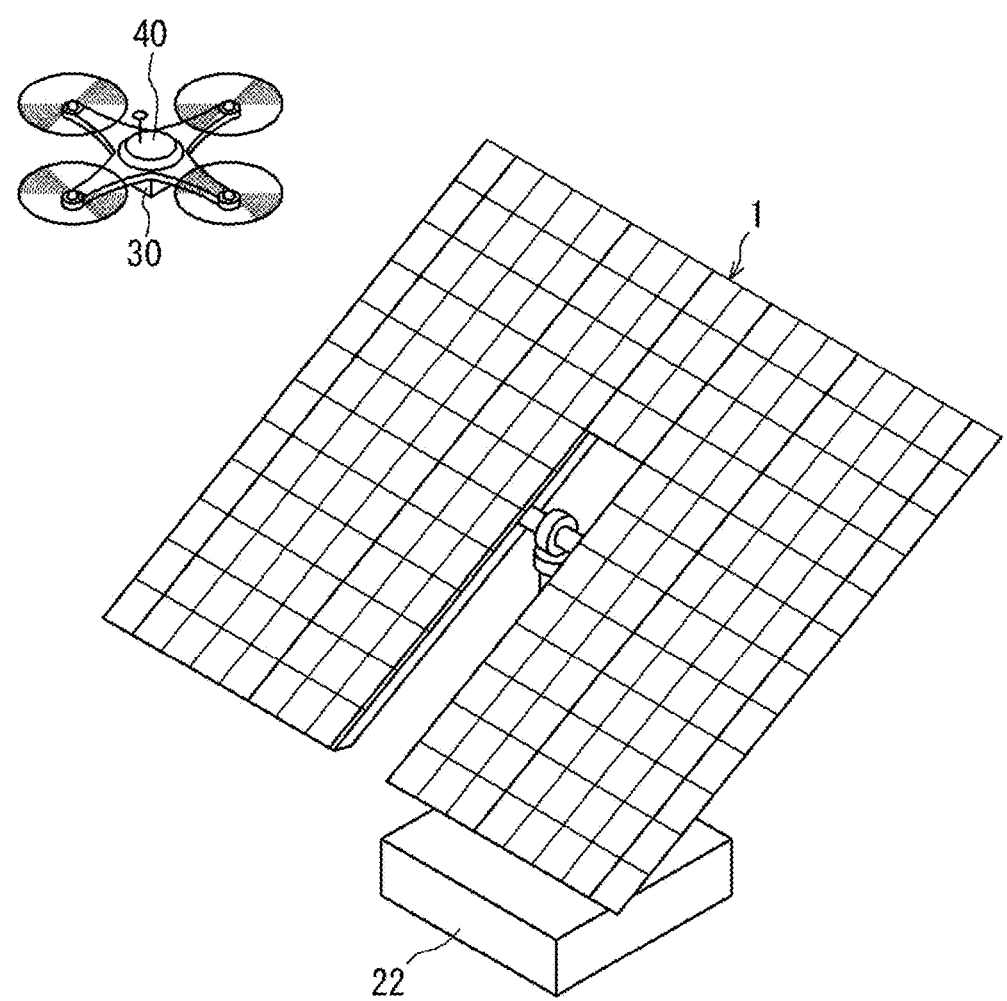
FIG. 13 is a perspective view illustrating a situation where: the camera is installed in a small unmanned aerial vehicle (so-called drone) that can be remotely operated or automatically piloted; and the array is photographed.

FIG. 13 is a perspective view illustrating a situation where: the camera 30 is installed in a small unmanned aerial vehicle 40 (a so-called drone) that can be remotely operated or automatically piloted; and the array 1 is photographed. If photographing is performed in this manner, work burden is small. The unmanned aerial vehicle 40 can easily and quickly photograph the entire surface of the array 1 from an arbitrary position and distance. In addition, the unmanned aerial vehicle can perform photographing during photovoltaic power generation, with the back side thereof oriented toward the sun. Theoretically, a large and manned aerial vehicle (helicopter, for example) can be employed, but a large shadow of the aerial vehicle needs to be avoided from being projected on the array 1.

Distance Between Imaging Device and Array

The composite virtual image as shown in FIG. 8 becomes smaller in accordance with decrease in the distance between the camera 30 and the array 1 (however, the camera 30 needs to be away from the array 1), and reversely, the composite virtual image becomes greater in accordance with increase in the distance. As a guide for selecting the distance, when it is assumed that the imaging device is in the perpendicular direction from the width center in the horizontal direction of one module 1M, a module acceptance angle θ is 0.5 degrees (width of angle: 1 degree). When the distance is defined as L relative to a width X of the module 1M, an approximation is L=X/sinθ≈X/θ. When the width X is 0.6 m, the distance L is 35 m. The distance L for viewing a composite virtual image corresponding to the width of 8 modules is 35 m×8=285 m. The distance L that allows a composite virtual image to be expanded over the entirety of the array 1 is 700 m, which is 20 times.

Another Example of Composite Virtual Image

Figure 16:
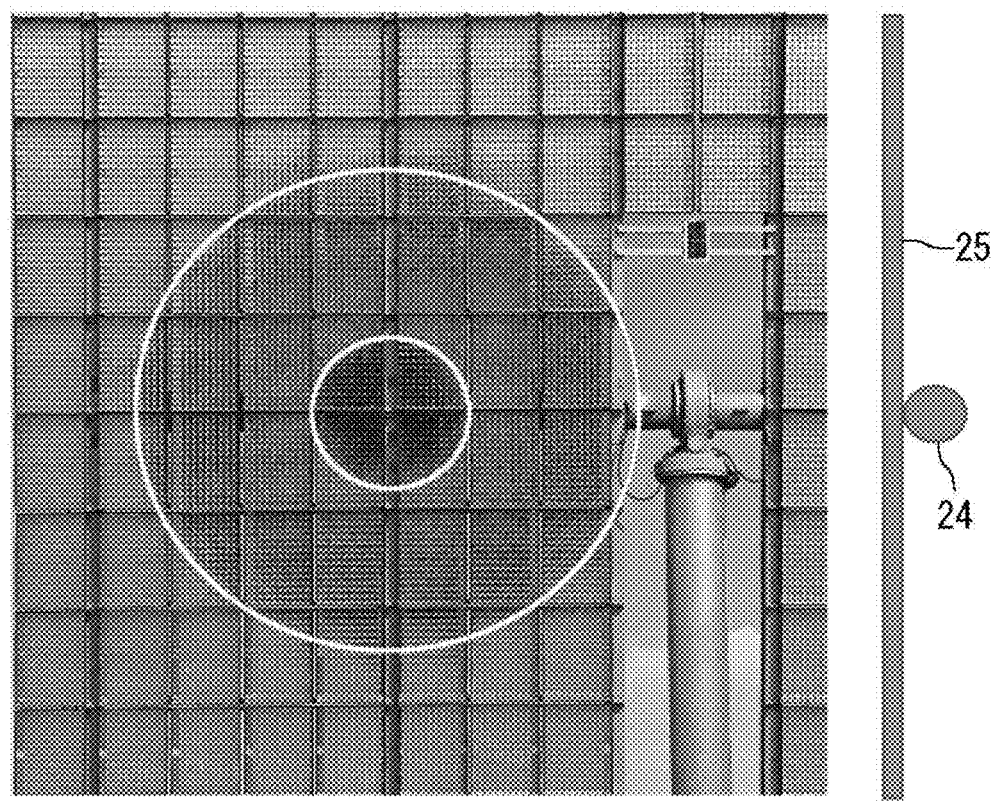
FIG. 16 shows a composite virtual image similar to that shown in FIG. 8, and a schematic diagram of a horizontal shaft and a tracking mount viewed from the side faces at that time.

FIG. 16 shows a composite virtual image similar to that shown in FIG. 8, and a schematic diagram of the horizontal shaft 24 and the tracking mount 25 viewed from the side faces at that time. If the tracking mount 25 is in a normal state without any deflection or deformation, a double circle as shown in FIG. 16 appears in the composite virtual image.

Figure 17:
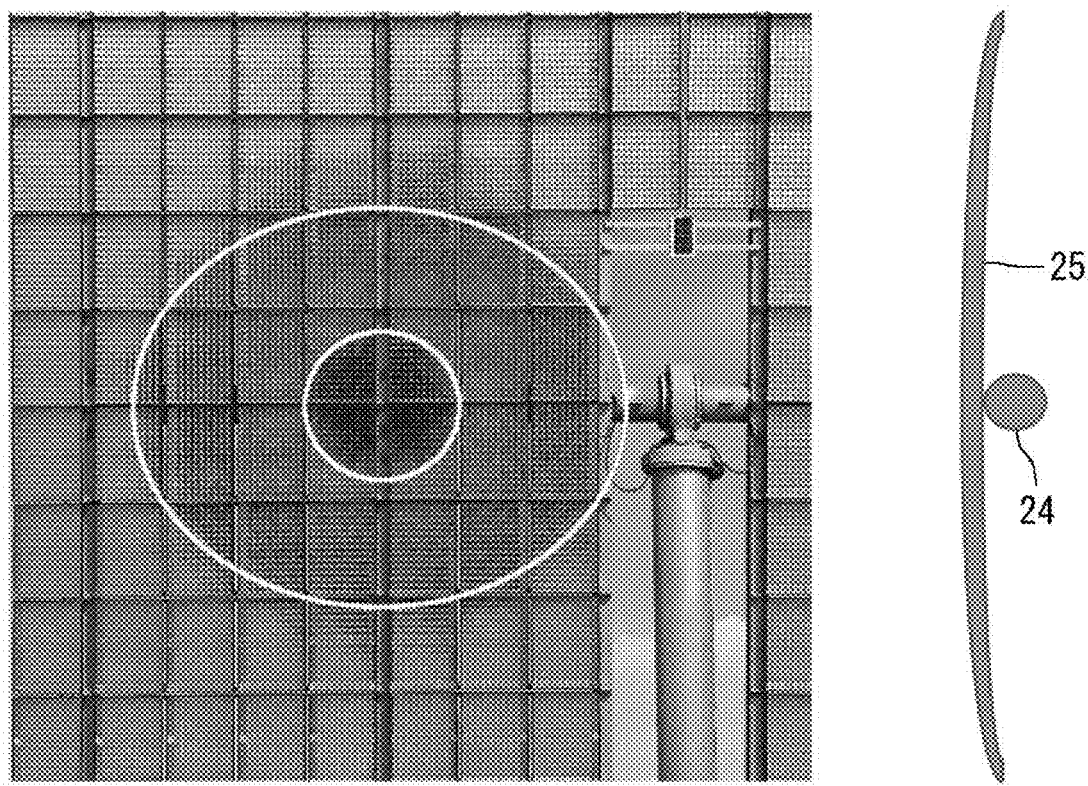
FIG. 17 shows a tracking mount deformed to be warped with respect to the horizontal shaft, and a composite virtual image at that time.

Next, FIG. 17 shows the tracking mount 25 deformed to be warped with respect to the horizontal shaft 24, and a composite virtual image at that time. As shown in FIG. 17, the shape, on the outer side, that should be circular is elliptical. FIG. 17 is an example of deformation of the tracking mount 25. However, various types of deformation such as a twisted deformation of the tracking mount 25, bending of the horizontal shaft 24, and the like appear as an abnormal shape of the composite virtual image. Due to such an abnormal shape, deformation of the tracking mount 25 or the horizontal shaft 24 can be found.

Another Example of Protection Plate

Figure 14:
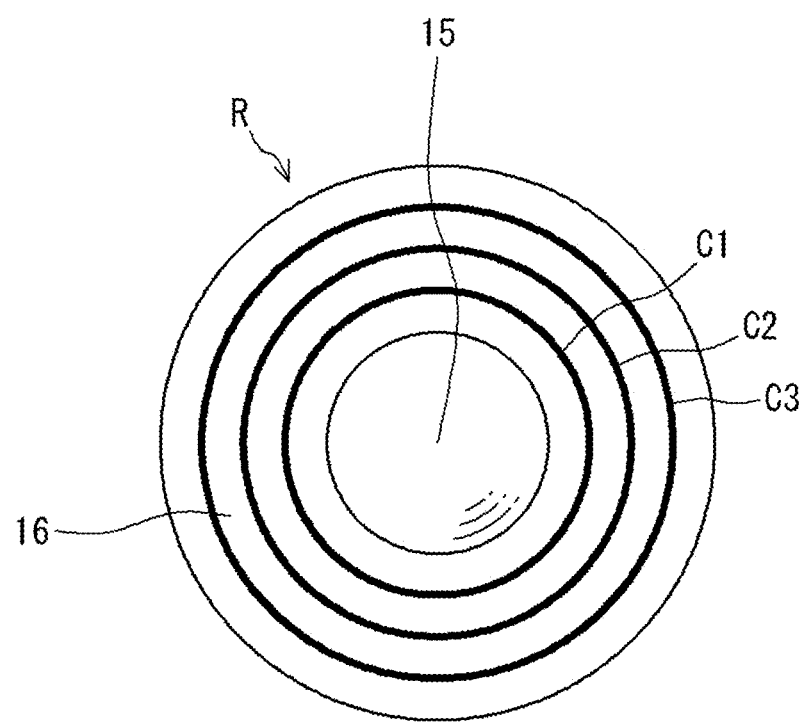
FIG. 14 is a plan view of the light receiving portion, showing another example of the protection plate.

FIG. 14 is a plan view of the light receiving portion R, showing another example of the protection plate 16. As the protection plate 16, a washer can be used, for example. If, on the surface thereof, division lines C1, C2, and C3 (forms serving as divisions) that provide clear contrast in the form of concentric circles are formed, for example, the division lines are reflected on the composite virtual image, and poor mounting can be easily found. In addition, the misalignment amount can be easily estimated, based on the division lines. The division lines C1, C2, and C3 can be easily provided by painting, for example.

Figure 15:
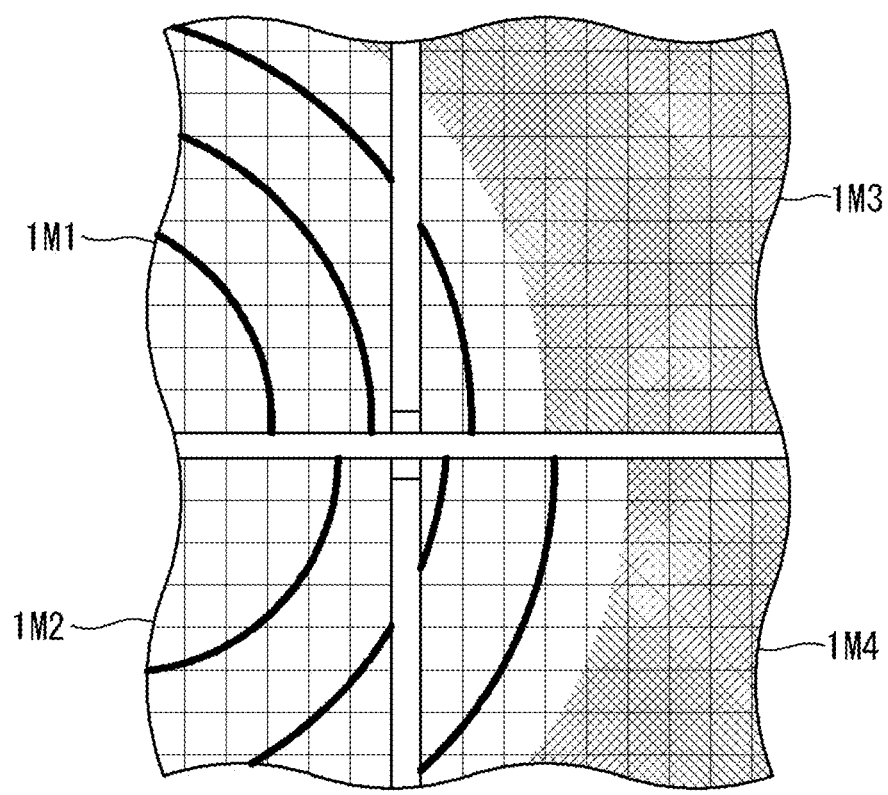
FIG. 15 is an enlarged view of a portion of a composite virtual image obtained when a protection plate with division lines is used, with the contrast in the feature portion emphasized for easy recognition.

FIG. 15 is an enlarged view of a portion of a composite virtual image obtained when a protection plate 16 with division lines is used, with the contrast in the feature portion emphasized for easy recognition. In the white portion in FIG. 15, the protection plate 16 is projected as a composite virtual image. The division lines are also projected in the composite virtual image. The boundary with respect to the dark portion on the outer side is the contour of the protection plate 16. Among the four projected modules 1M1, 1M2, 1M3, and 1M4, the modules 1M2 and 1M4 are obviously misaligned relative to the modules 1M1 and 1M3. Therefore, at least one of the modules 1M1, 1M3 and the modules 1M2, 1M4 are poorly mounted. In addition, the misalignment amount and the misalignment angle can also be estimated, based on the misalignment of the division lines.

Others

Further, photographing of the array 1 can be performed by a super high-precision imaging device installed in a stationary satellite.

Additional Note

In the above embodiment, a "concentrator-type" photovoltaic apparatus using the condenser lens has been described. However, a similar method for detecting a poor module-mounting-state and a similar array can also be applied to a "reflection-type" photovoltaic apparatus in which sunlight is reflected by a concave mirror and concentrated light is guided to a cell. This is because a concave mirror can also have a virtual image projected, similar to the Fresnel lens.

When the wording "concentrating body" is used as a common concept between the condenser lens and the concave mirror, the following expression is possible. This method for detecting a poor-module-mounting-state is a method for detecting a poor module-mounting-state in a photovoltaic apparatus, the method comprising:
 photographing a surface of an array by an imaging device; obtaining an image in which
  a virtual image, magnified via a concentrating body, of a light receiving portion including a cell and a vicinity thereof is formed, and
  a collection of pixels of the virtual image forms a composite virtual image of an entirety of the light receiving portion, the composite virtual image being projected over a plurality of modules; and
 detecting a poor module-mounting-state based on a form of the composite virtual image.

The array is an array formed by arraying a plurality of modules of a photovoltaic apparatus on a tracking mount, each module having a basic configuration serving as an element thereof, the basic configuration comprising:
 a concentrating body;
 a cell for power generation, the cell being provided at a position where sunlight is concentrated by the concentrating body;
 a secondary lens provided between the concentrating body and the cell, the secondary lens being configured to guide light concentrated by the concentrating body, to the cell; and
 a protection plate provided around the secondary lens, the protection plate being configured to reflect light, the protection plate having formed thereon a form serving as a division at least.

Supplementary Note

The above embodiments are merely illustrative in all aspects and should not be recognized as being restrictive. The scope of the present disclosure is defined by the scope of the claims, and is intended to include meaning equivalent to the scope of the claims and all modifications within the scope.

REFERENCE SIGNS LIST 1 array
1M module
1M1, 1M2, 1M3, 1M4 module
2 support device
11 housing
11b bottom face
12 concentrating portion
12a glass plate
12f condenser lens
13 flexible printed circuit
14 cell package
15 secondary lens
16 protection plate
17 shielding plate
17a opening
18 cell
19 resin
21 post
22 base
23 biaxial drive part
24 horizontal shaft
25 tracking mount
25a reinforcement member
25b rail
30 camera
40 unmanned aerial vehicle
100 photovoltaic apparatus
Ac, Ax, $A_{m1}$, $A_{m2}$, $A_{m3}$, $A_{m4}$ optical axis
As incident direction
C1, C2, C3 division line
m1, m2, m3, m4 module
R light receiving portion

The invention claimed is:
1. A method for detecting a poor module-mounting-state in a concentrator photovoltaic apparatus, the method comprising:
 photographing a surface of an array by an imaging device;

obtaining an image in which
- a virtual image, magnified through a condenser lens, of a light receiving portion including a cell and a vicinity thereof is formed, and
- a collection of pixels of the virtual image forms a composite virtual image of an entirety of the light receiving portion, the composite virtual image being projected over a plurality of modules; and detecting a poor module-mounting-state based on a form of the composite virtual image.

2. The method for detecting the poor module-mounting-state according to claim 1, wherein
the light receiving portion is provided with: a secondary lens configured to take in light concentrated by the condenser lens; and a protection plate configured to reflect light, and
at least a shape of the protection plate is reflected in the composite virtual image.

3. The method for detecting the poor module-mounting-state according to claim 2, wherein
the protection plate has a shape that is annular.

4. The method for detecting the poor module-mounting-state according to claim 2, wherein
a poor module-mounting-state is detected, based on deformation of the shape of the protection plate, the shape being reflected in the composite virtual image.

5. The method for detecting the poor module-mounting-state according to claim 1, wherein
the imaging device is installed in an aerial vehicle.

6. The method for detecting the poor module-mounting-state according to claim 3, wherein
a poor module-mounting-state is detected, based on deformation of the shape of the protection plate, the shape being reflected in the composite virtual image.

7. The method for detecting the poor module-mounting-state according to claim 2, wherein
the imaging device is installed in an aerial vehicle.

8. The method for detecting the poor module-mounting-state according to claim 3, wherein
the imaging device is installed in an aerial vehicle.

9. The method for detecting the poor module-mounting-state according to claim 4, wherein
the imaging device is installed in an aerial vehicle.

10. A method for detecting a poor module-mounting-state in a photovoltaic apparatus, the method comprising:
photographing a surface of an array by an imaging device;
obtaining an image in which
- a virtual image, magnified via a concentrating body, of a light receiving portion including a cell and a vicinity thereof is formed, and
- a collection of pixels of the virtual image forms a composite virtual image of an entirety of the light receiving portion, the composite virtual image being projected over a plurality of modules; and detecting a poor module-mounting-state based on a form of the composite virtual image.

* * * * *